United States Patent [19]

Biggs et al.

[11] Patent Number: 5,702,049

[45] Date of Patent: Dec. 30, 1997

[54] ANGLED WIRE BONDING TOOL AND ALIGNMENT METHOD

[75] Inventors: Kenneth L. Biggs, Orange; John Cairl Price, Rancho Mirage, both of Calif.

[73] Assignee: West Bond Inc., Anaheim, Calif.

[21] Appl. No.: 474,242

[22] Filed: Jun. 7, 1995

[51] Int. Cl.⁶ .................................. H01L 21/607
[52] U.S. Cl. .................. 228/105; 228/4.5; 228/180.5
[58] Field of Search ................ 228/4.5, 105, 180.5, 228/44.7

[56] References Cited

U.S. PATENT DOCUMENTS

| | | | |
|---|---|---|---|
| 3,461,538 | 8/1969 | Worcester et al. | 228/4.5 X |
| 4,817,848 | 4/1989 | Gabaldon | 228/105 X |
| 4,855,928 | 8/1989 | Yamanaka | 228/4.5 X |
| 5,437,405 | 8/1995 | Asanasavest | 228/180.5 |
| 5,445,306 | 8/1995 | Huddleston | 228/4.5 X |
| 5,495,976 | 3/1996 | Mironesco et al. | 228/180.5 X |

*Primary Examiner*—Kenneth J. Ramsey
*Attorney, Agent, or Firm*—William L. Chapin

[57] ABSTRACT

An alignment method for ultrasonic wire bonders of the type using capillary ball type and wedge type bonding tools utilizes a bonding tool construction having an elongated shank angle obliguely At any desired azimuthal angle from the lower working face of a tool tip. This angular offset allows a workpiece to be positioned laterally to place a desired wire bond site on an integrated circuit or other such workpiece in precise alignment with a target image in the field of view of a television camera or other optical imaging device viewing the location of a desired bond site along the line of action of the tool tip. Because of the angular offset construction of the bonding tool, the line of site of the imaging device is coincident with the line of action of the tool tip eliminating parallax errors and permitting viewing of the bond site continuously during motion of the tool tip along its line of action.

8 Claims, 13 Drawing Sheets

METHOD #3

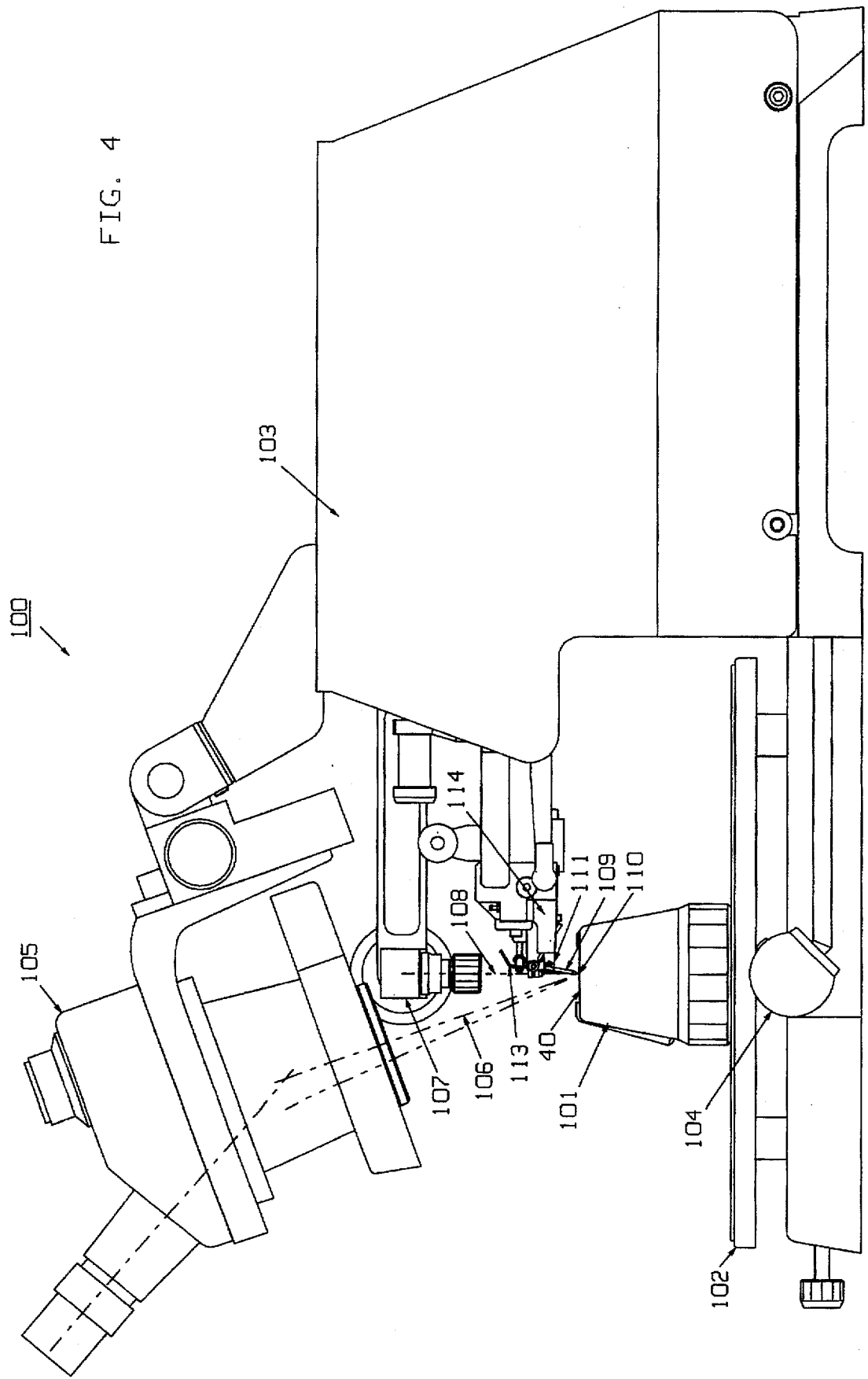

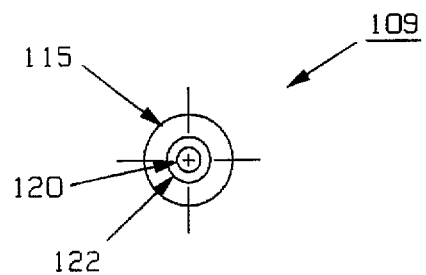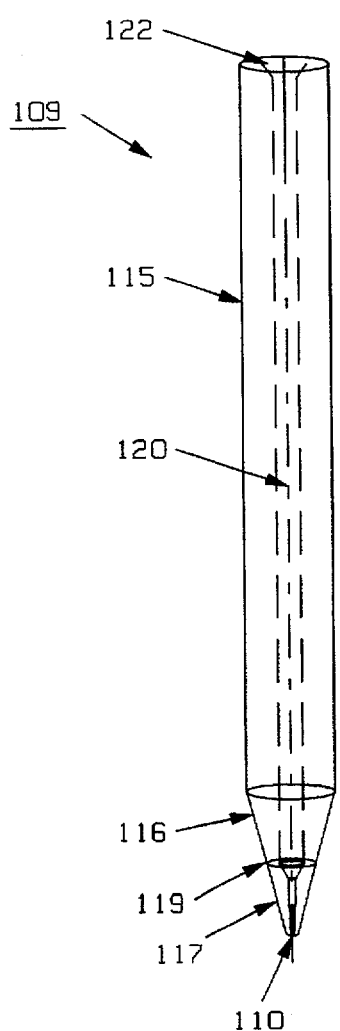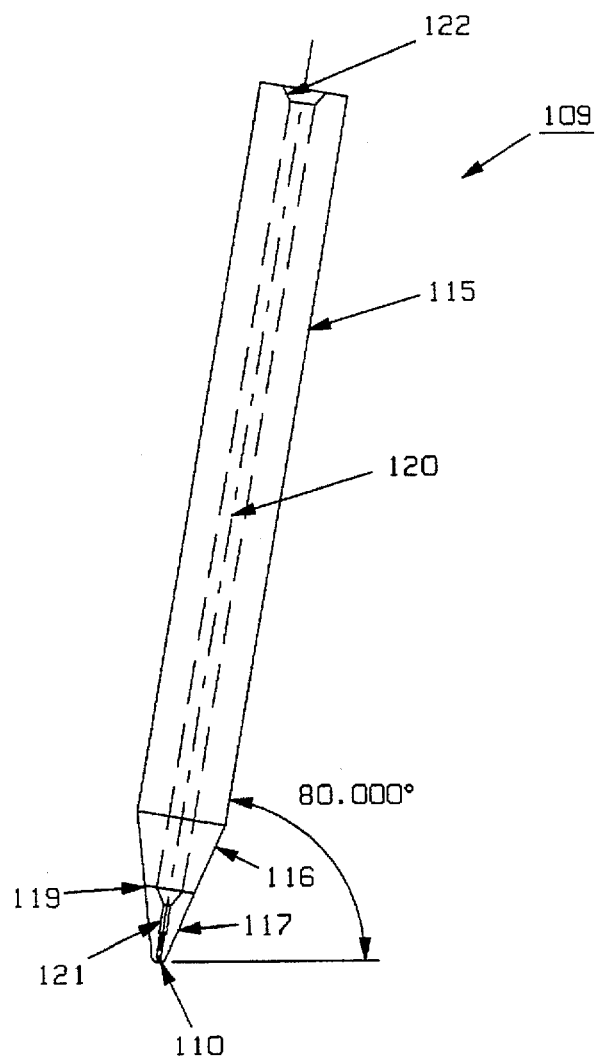

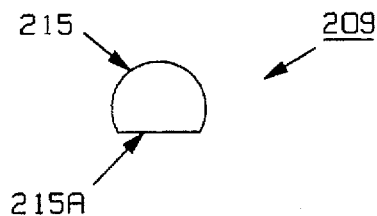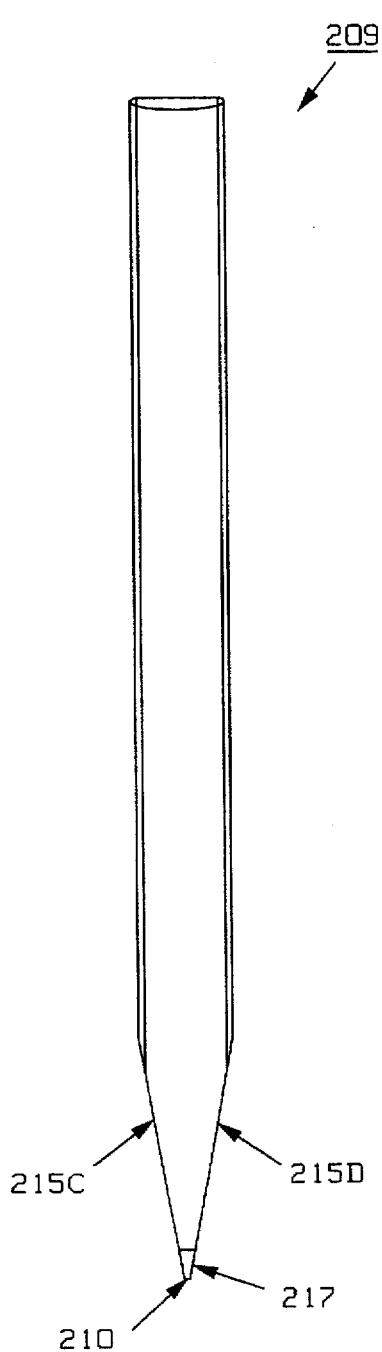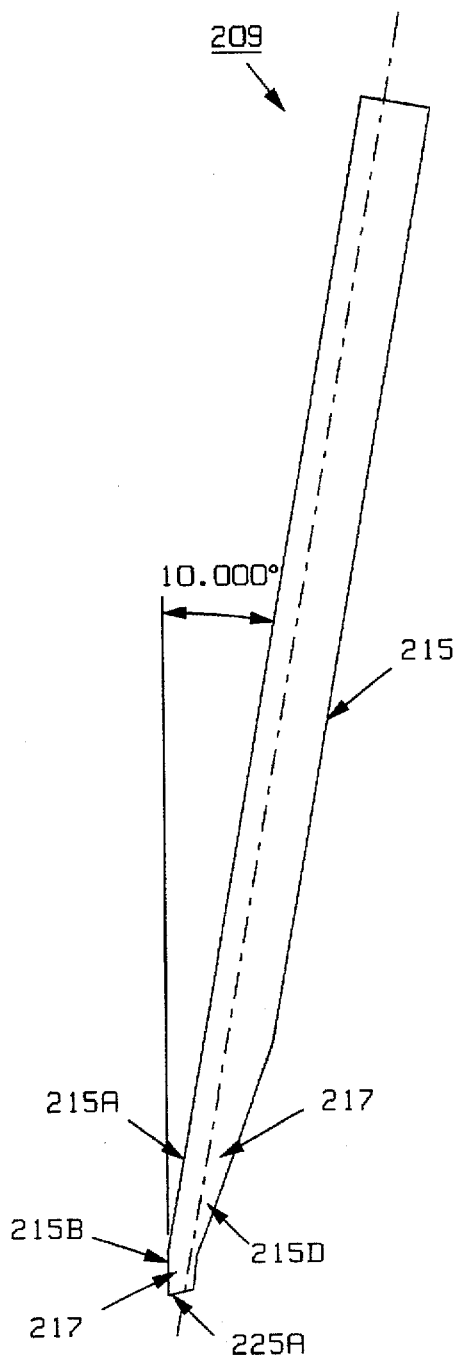

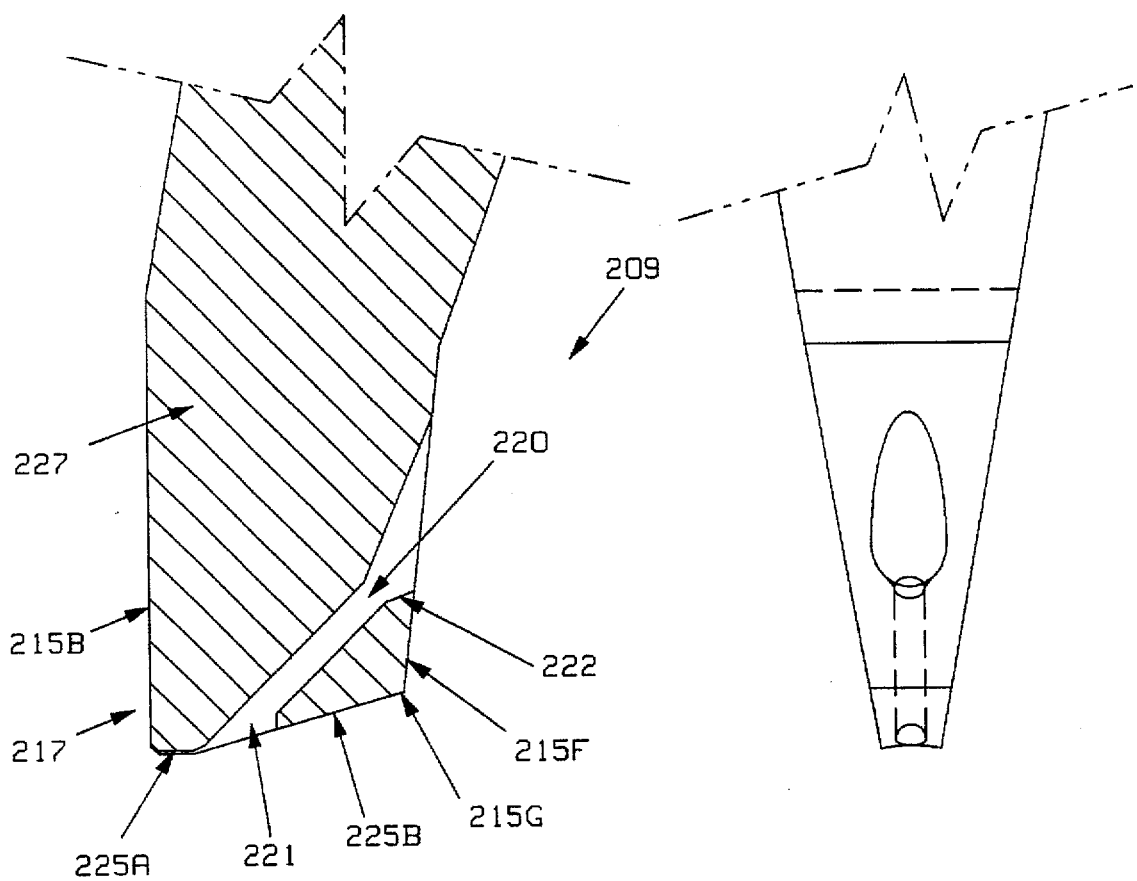
FIG. 23
FIG. 22
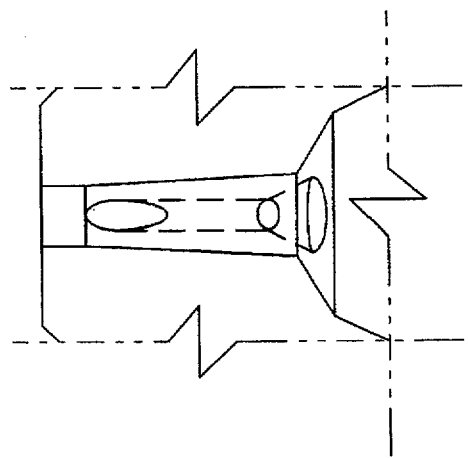
FIG. 24

ANGLED WIRE BONDING TOOL AND ALIGNMENT METHOD

BACKGROUND OF THE INVENTION

A. Field of the Invention

The present invention relates to an apparatus for use with wire bonding machines, of the type used to bond fine conductive wires to miniature electronic devices, such as integrated and hybrid micro-circuit chips. More particularly, the invention relates to improvements in wire bonding tools which allows continuous direct and normal viewing of workpiece locations being bonded, thereby eliminating parallax errors in alignment of the bonding tool line of action with a prospective bonding site, and eliminating mechanical displacement of the tool to perform alignment.

B. Description of Background Art

Miniature electronic circuits, or micro-circuits are used in vast quantities, in a wide variety of consumer, commercial, industrial and military apparatus. The majority of such micro-circuits are of a type referred to as integrated circuits. Integrated circuits contain large numbers of active circuit elements such as transistors, and passive elements such as resistors and capacitors. In semiconductor integrated circuits, conductive paths between circuit elements on a semiconductor substrate are formed by selectively etching the substrate. In hybrid micro-circuits, circuit elements mounted on a ceramic substrate are typically interconnected by conductive ink paths on the substrate.

Functional portions of integrated circuits are typically in the form of very small, rectangular-shaped chips, ranging in size from 0.025 inch to 0.200 inch or more on a side. Input connections to integrated circuit chips are usually made by bonding a very fine wire to a conductive pad on the chip; the other end of each wire being bonded to a conductive terminal or lead that is sufficiently large and robust to be inserted into a printed circuit board and soldered to conductors on the board.

Bonding wire used to interconnect the pads of a semiconductor chip to terminals of a package containing the chip is usually aluminum or gold, and is quite fine, having a diameter of about 1 mil. (0.001 inch). This wire must be bonded to small, typically rectangular-shaped, integrated circuit pads a few mils on a side.

The most common method of interconnecting wires between semiconductor chip pads and external terminals is to form a weld or bond at each end of a conducting wire. The bonds are formed by the application of heat, pressure, ultrasonic energy, or a combination of these. To form such bonds, the free end of a length of bonding wire is placed in contact with a pad. The tip of a tool coupled to an ultrasonic generator is then pressed against the wire, and energized with ultrasonic energy for a short time interval, welding the wire to the pad. The unbonded length of wire is then moved to other pads, and bonded thereto by the same process. The wire is then severed at the heel of the terminating bond.

Typical wire bonding machines used for ultrasonic welding of wires to micro-circuit pads include an elongated, vertically disposed, force-applying member or "tool." The tool is connected at the upper end thereof to a source of ultrasonic energy, such as a piezoelectric transducer connected to an electrical energy source alternating at an ultrasonic frequency. Usually, the tool is connected to the transducer through a tapered or otherwise shaped horn structure that matches the acoustic input impedance of the small tool to the output impedance of the larger transducer.

Ultrasonic bonding tools used to bond wires to microcircuit pads are of two main types. One type, referred to as a wedge bonder, has a flat or concave lower working face adapted to press a bonding wire into contact with a pad, while ultrasonic energy is applied through the tool to the wire to form an ultrasonic weld. The working face must be quite small to permit bonding to small microcircuit pads, without contacting adjacent circuit elements. Typical working faces have a rectangular shape only about a few mils along a side. Because of the very small sizes involved, microcircuit wire bonding is usually done while viewing the pad and tool tip in a stereo microscope, using a precision manipulator mechanism comprising part of the bonding machine to manipulate the microcircuit so as to position the pad directly below the tool tip.

In most wire bonding machines, the bonding tool is adapted to manipulate bonding wire over a pad, prior to performing the bonding operation. Such bonding tools may include an upwardly angled lower face rearward of the working face, and a generally vertically disposed rear face. An angled bore or guide hole having an entrance aperture in the rear face and an exit aperture in the angled lower face permit bonding wire from a spool mounted upward and rearward of the tool to be paid out through the exit aperture of the angled lower face. Typically, a remotely actuable clamp located rearward of the guide hole entrance and movable with the tool is used to feed bonding wire through the guide hole of the tool.

The clamp used to effect movement of wire through the guide hole of a bonding tool usually consists of a pair of jaws that may be closed to grip the wire, or opened to allow free travel of the wire. Generally, such clamps may be moved toward and away from the guide hole entrance, typically on a line of movement which coincides with the axis of the guide hole. To feed wire through the guide hole, the jaws of the clamp are first opened, and the clamp then moved away from the guide hole. The jaws are then closed to grip the wire, and then moved towards the guide hole, thus feeding wire through the guide hole.

In wire bonding machines of the type described above, the machine is used to move the bonding tool to the proper position to bond wire to a pad, feed wire out through the guide hole exit aperture, move the tool to another pad and form another bond. In this manner, any desired number of pads or other elements of a circuit can be connected together, in a procedure referred to a "stitch" bonding. After the last bond in a series of bonds has been made, the wire must be severed, to permit making other, unconnected bonds. Oftentimes, the bonding tool itself is utilized to sever the bonding wire.

Another type of bonding tool, referred to as a capillary, uses a fine wire, usually made of gold, that protrudes through a capillary tube and is melted with a miniature torch or electronic arc discharge to form a fused ball at the end of the wire. The tool is then moved downwards until the ball is pressed against a pad on a semi-conductor die, whereupon ultrasonic energy with or without heat is applied by the tool to the ball/pad interface, causing a first, ball bond or weld to be formed. Next, the tool is moved vertically and then laterally away from the die pad to a position directly above a desired lead attachment point, while paying out a loop of wire from its attachment point at the ball bond on the die pad. The tool is then moved downwards, pressing the laterally disposed end of the wire loop into contact with the lead, whereupon ultrasonic energy is again applied, forming a laterally disposed stitch bond. The tool is then moved away from the last bond to sever the end of the wire. Finally, the tool is raised, and a fused ball formed on the end of the severed wire protruding through the capillary, completing a bonding cycle.

Now the integrated circuit pads which are connected to leads by wire bonding are extremely small, typically in the range of 0.001 inch to 0.004 inch. Therefore, the bonding tool that is used to form the bonds, whether it be a wedge or capillary type, must be precisely aligned with X-Y axis coordinates of the intended bonding point on a pad or lead, before the tool is moved downwards in the Z axis direction to form a bond. Accordingly, as was previously stated, a high power stereoscopic microscope is usually employed with such bonding machines to permit an operator of the machine to perform necessary alignment of the workpiece with respect to the vertical line of action (Z axis) of the bonding tool. This alignment is performed either by moving the bond tool tip directly above a desired bonding location on the workpiece or by moving the workpiece directly below the bond tool tip.

Several prior art methods for aligning the line of action of wire bonding tool with a workpiece location are in current use. One such method, shown in FIG. 1, utilizes a light beam focused to a point on a workpiece, the axis of the projector being angularly offset from the vertical sufficiently to clear the ultrasonic transducer horn that drives the upper end the bonding tool. A disadvantage of this method is that a substantially bright spot is required to provide sufficient contrast in the microscopic field of view. This generally requires a large lamp that produces undesirable heat, and consumes significant amounts of electrical power. Another disadvantage of this alignment method is that the intersection of the bonding tool tip line of action with the beam axis is a single point; thus, if the axis of the spot projector is aligned so that the spot intersects the workpiece at the precise point where the tool tip will contact the workpiece when the tool is moved downward along the Z-axis line of action of the tool, moving the workpiece up or down will introduce a parallax error, so that the tool tip will not contact the point indicated by the spot.

Another prior art bonding tool alignment method that represents a substantial improvement in prior alignment methods is disclosed in U.S. Pat. No. 4,000,948, Miller, Target Method And Systems For Bonding Machines. As shown in FIG. 2, this method utilizes a partially reflecting diagonal mirror that serves as a beam combiner between a viewing microscope and the line action of a wire bonding tool, and a target image projected onto the mirror by a projector having an illuminated target transparency oriented perpendicularly to one side of the viewing microscope line of sight. The level of target illumination competes with the level of light that is reflected from the workpiece rather than the level of light that is directed toward the workpiece, as does the previously discussed method illustrated in FIG. 1. Therefore, the target image can be generated with a light-weight lamp that produces very little heat.

A third method of aligning a wire bonding tool, shown in FIG. 3, employs a vertically-mounted video camera and Closed Circuit Television (CCTV) system that utilizes a cross-hair superimposed on the camera field of view as a reference point. With the bonding tool moved laterally away from the reference point to an offset position, the workpiece is moved laterally until a desired point on the workpiece is aligned with the reference point. The bonding tool is then moved laterally back to a "home" position in which the line of action of the bonding tool is precisely aligned with the reference point, whereupon the tool may be moved downwards to form a bond at the desired point on the workpiece. This method eliminates the parallax problems of the two methods discussed above. However, the CCTV method requires lateral motion of the bonding tool, to move it out of the camera field of view to an offset position. Moreover, in an automatic bonding machine, a workpiece is moved with X and Y axis servomotors to position a desired bonding point on the workpiece into alignment with the camera reference cross hairs. Thus, the offset tool travel in the horizontal direction must be accounted for in the automatic bonding machine's computations of workpiece X and Y coordinate drive increments required to position other workpiece bond locations under the bonding tool. These computations and motions increase the complexity and cycle time of bonding machine operations. In a variation of this method, the workpiece is offset from the bonding tool location to perform an initial alignment of a workpiece aim point with the camera cross hairs, but this variation does not reduce the complexity of required computations, or reduce the cycle time. Since the lateral offset motions required by this method can require 100 msec to 200 msec, it can be appreciate that a bonding machine that can make 10 bonds per second will have its throughput substantially reduced by the offset motions required by this alignment method.

In view of the shortcomings of prior art bonding machine alignment methods described above, the present invention was conceived of.

OBJECTS OF THE INVENTION

An object of the present invention is to provide a wire bonding tool that allows continuous viewing along the line action of the tool of the impact point of the tool with a workpiece.

Another object of the invention is to provide a wire bonding tool that has a longitudinal axis which is angularly offset from the line of action of the tool.

Another object of the invention is to provide a transducer horn for coupling acoustic energy from an ultrasonic force generating transducer to an ultrasonic bonding tool, in which the bonding tool is fastened at an oblique angle to the output end of the horn.

Another object of the invention is to provide a transducer horn for ultrasonic bonding machines having a bore for receiving an ultrasonic bonding tool that is obliquely inclined to the longitudinal axis of the transducer.

Another object of the invention is to provide a parallax error-free method for aligning a location on a workpiece with the prospective impact point of an ultrasonic bonding tool on the workpiece.

Another object of the invention is to provide a method for aligning a location on a workpiece with the prospective impact point on the workpiece of an ultrasonic bonding tool, in which the location may be continuously viewed along the line of action of the tool, even during movement of the tool along the line of action.

Various other objects and advantages of the present invention, and its most novel features, will become apparent to those skilled in the art by perusing the accompanying specification, drawings and claims.

It is to be understood that although the invention disclosed herein is fully capable of achieving the objects and providing the advantages described, the characteristics of the invention described in this specification are merely illustrative of the preferred embodiment. Accordingly, we do not intend that the scope of our exclusive rights and privileges in the invention be limited to details of the embodiments described. We do intend that equivalents, adaptations and modifications of the invention reasonably inferable from the description contained herein be included within the scope of the invention as defined by the appended claims.

SUMMARY OF THE INVENTION

Briefly stated, the present invention comprehends an improved method for aligning ultrasonic wire bonding machine tools with bonding locations on a workpiece, particularly a microcircuit, and improvements in ultrasonic bonding tools and transducer horns for practicing the improved method. The methods and articles of the present invention are useable both with wedge bonding and capillary bonding machines.

According to the present invention, an ultrasonic wire bonding tool is provided that has an elongated tubular body, the body having a lower working face that is angled obliquely to the longitudinal axis of the body. Thus, with the working face of the tool in flat abutting contact with a workpiece surface during the process of forming a wire bond therewith, the body of the tool is angularly offset from the tool line of action, which is normal to the tool working face and the workpiece. This offset allows continuous viewing of the bond site during the motion of the tool tip downwards along its line of action to the workpiece, thus allowing the workpiece to be moved laterally to place a desired workpiece bond site in precise vertical alignment with a cross hair target within the field of view of a television camera or other optical device viewing the location of a desired bond site along the tool tip line of action.

The present invention includes a transducer horn having a rear cylindrical body section adapted to efficiently receive longitudinally propagating ultrasonic wave energy from a generally horizontally disposed ultrasonic transducer, and a frustoconically tapered front section that tapers to a smaller front diameter front face. The horn has a transversely disposed bore near the front face of the horn that holds the upper portion of the ultrasonic tool body, the bore lying in a vertical plane and inclined at the same oblique angle to the longitudinal axis of the horn as the angle between the longitudinal axis and working face of the tool. This arrangement positions the flat portion of the working face of the tool substantially parallel to the longitudinal line of action of the ultrasonic transducer, thereby providing, in spite of the oblique orientation of the tool axis, efficient coupling of transducer energy to produce a lateral scrubbing action of a wire positioned between the tool working face and a metallized workpiece pad, the scrubbing action causing a weld bond to be formed between the wire and the pad.

BRIEF DESCRIPTION OF THE DRAWINGS

FIG. 3A is an upper plan view of an integrated circuit of the type of wire binding machines that are used to make lead bonds on.

FIG. 4 is a side elevation view of a capillary wire bonding machine employing an angled capillary tool and transducer horn according to the present invention, on a reduced scale.

FIG. 6 is a side elevation view of an angled capillary bonding tool used in the machine shown in FIG. 4, on a substantially enlarged (approximately 10×) scale.

FIG. 7 is a rear elevation view of the tool of FIG. 6.

FIG. 8 is an upper plan view of the tool of FIG. 6.

FIG. 19 is a side elevation view of an angled wedge bonding tool used in the machine of FIG. 17 on a substantially enlarged (approximately 10×) scale.

FIG. 20 is a rear elevation view of the tool of FIG. 19.

FIG. 21 is an upper plan view of the tool of FIG. 19.

FIG. 22 is a rear elevation view of the tip of the tool shown in FIG. 19, on a further enlarged (approximately 100×) scale.

FIG. 23 is a side sectional view of the tool tip shown in FIG. 22, taken along line 23—23.

FIG. 24 is an upper plan view of the tool tip of FIG. 22.

DETAILED DESCRIPTION OF THE PREFERRED EMBODIMENTS

Figure 1:
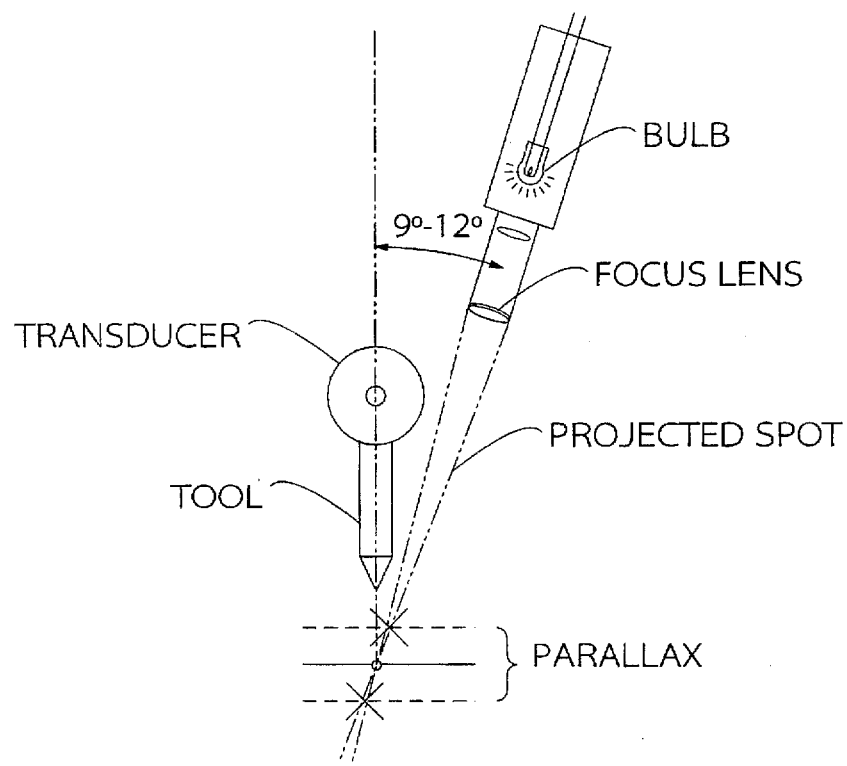
FIG. 1 is a pictorial view of a first type of prior art wire bonding machine alignment method that uses a target image projected on a workpiece.
Figure 2:
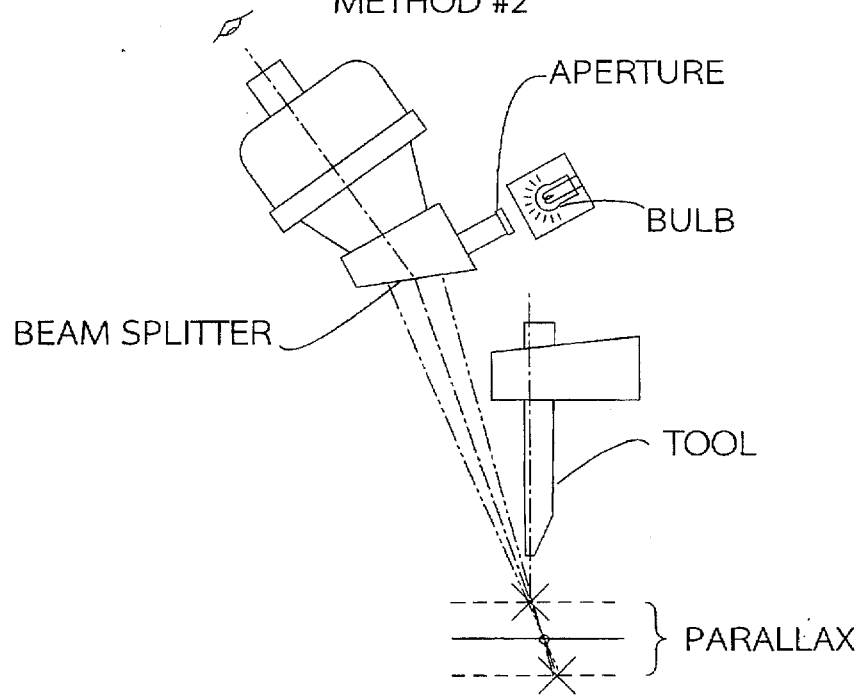
FIG. 2 is a pictorial view of a second type of prior art wire bonding machine alignment method that uses a beam combiner.
Figure 3:
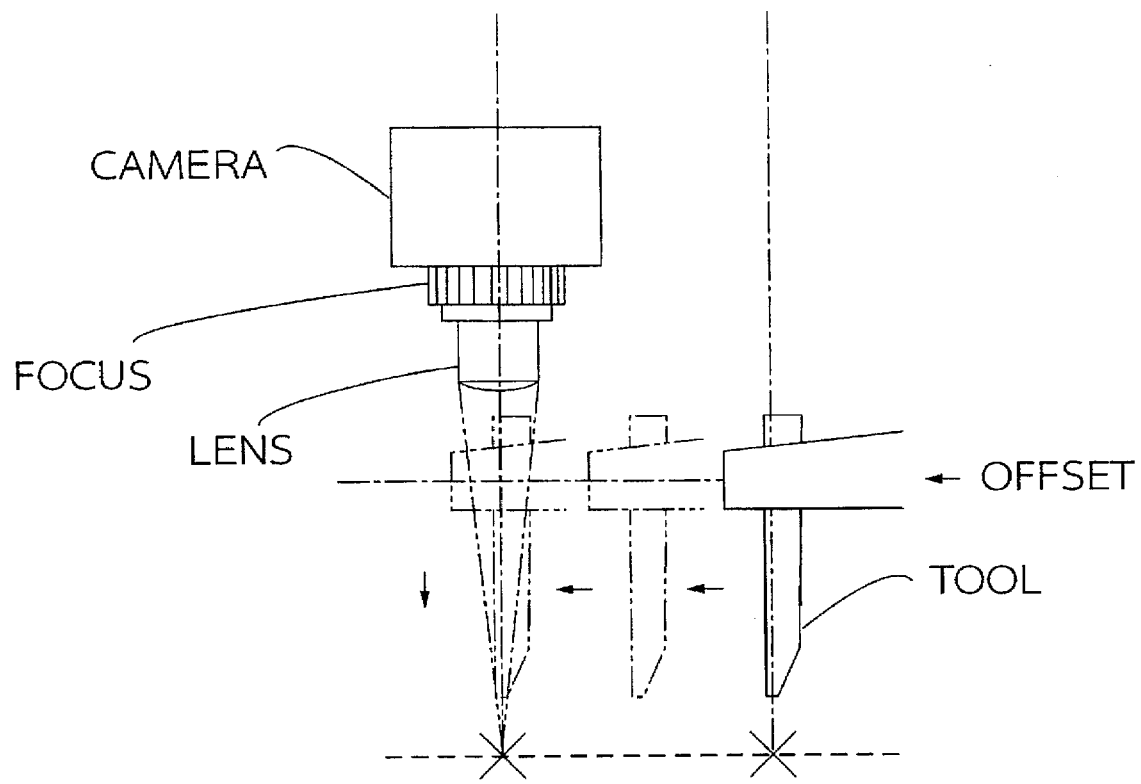
FIG. 3 is a pictorial view of a third type of prior art wire bonding machine alignment method that uses a laterally offsetable bonding tool or offsetable workpiece.
Figure 3A:
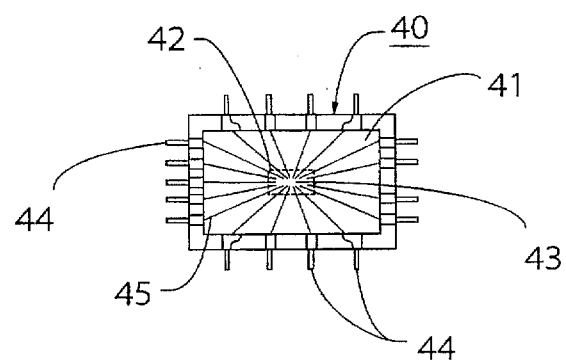

FIGS. 1–3 illustrate prior art bonding tool alignment methods, which were described briefly above. FIG. 3A is an upper plan view of a typical workpiece 40 of the type wire bonding machines are used to make wire bonds on. Example workpiece 40 is an integrated circuit that includes a base or substrate 41 on which an integrated circuit chip 42 is mounted. Chip 42 has electrically conductive pads 43 on its upper surface, which are in electrically conductive contact with internal electronic components of the chip. Integrated circuit 40 also includes a plurality of leads 44 that protrude from the periphery of substrate 41. Electrical connections are made between each chip pad 43 and lead 44 by a separate, fine aluminum or gold wire 45. Each wire 45 is bonded at one end of the wire to a pad 43 and at the other end of the wire to a lead 44. The bonds are made by an ultrasonic bonding machine employing a capillary tube bonding tool, or a wedge bonding tool.

FIGS. 4–29 illustrate angled wire bonding apparatus and methods according to the present invention.

Referring now to FIG. 4, a capillary wire bonding machine employing a novel angled capillary tool and a novel transducer horn according to the present invention is shown. As shown in FIG. 4, angled capillary tool wire bonding machine 100 according to the present invention includes a work holder 101 mounted on a platform 102, the latter being movable with respect to the main body 103 of the machine by manual control of a micro-positioner handle 104. Platform 102 is also rotatable with respect to main body 103 of machine 100, to permit angular adjustment of a workpiece 40 on the platform.

Machine 100 includes a stereoscopic microscope 105 mounted to main body 103 of the machine. Microscope 105 has a field of view indicated generally by lines 106, that includes at least a portion of a workpiece 40 mounted on platform 102. According to the present invention, machine 100 also includes an optical imaging device 107 mounted above platform 102, the optical imaging device having a central field line of sight or bore sight 108 that impinges normally, i.e., perpendicularly, directly on that location point on a workpiece 40 which is contacted by the tip 110 of an ultrasonic capillary bonding tool 109, when the tool moves vertically downwards towards the workpiece. In the preferred embodiment, optical imaging device 107 is a Closed Circuit Television (CCTV) camera that employs a solid-state, Charge Coupled Device (CCD) image sensor. Imaging device 107 also preferably includes a reticle that superimposes at least one fixed reference point, such as the intersection of a pair of cross hairs, in the field of view of the imaging device.

Capillary bonding tool 109 has an elongated straight tubular body section 15 which is inclined rearward from bore sight 108 of optical imaging device 107. The upper end of tool body 115 is fastened to the outer end of an ultrasonic transducer horn 111. The novel offset construction of capillary bonding tool 109, and ultrasonic transducer horn 111, which will be described in detail below, permits bore sight 108 of optical imaging device 107 to coincide with the vertical line of action 112 of tool tip 110.

Figure 5:
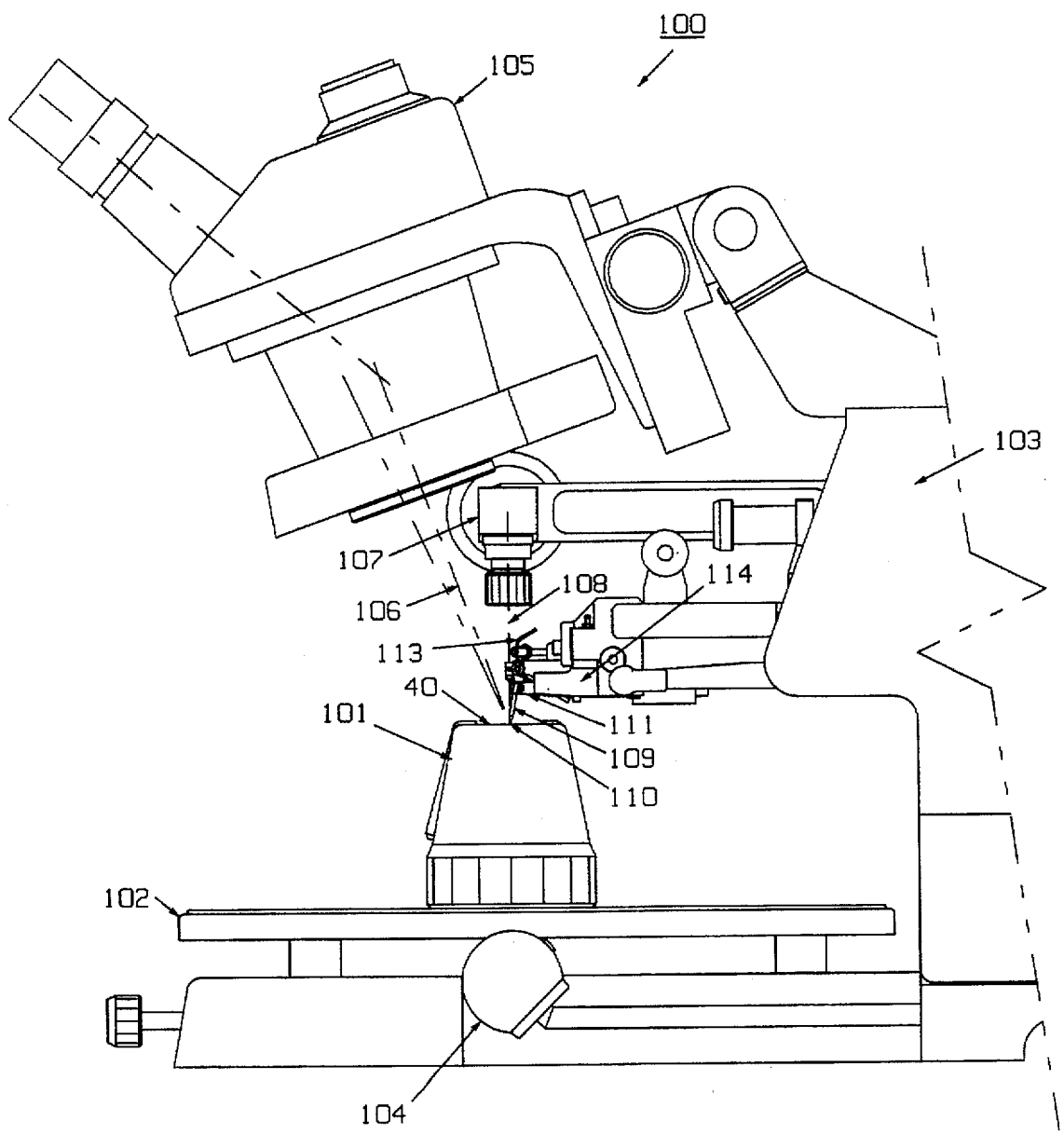
FIG. 5 is a fragmentary view of the machine of FIG. 4, on a somewhat enlarged scale.

Referring now to FIG. 5, angled capillary tool wire bonding machine 100 may be seen to include a bonding wire feed mechanism 113, and an ultrasonic transducer 114. Ultrasonic transducer 114 comprises a generally horizontally disposed, longitudinally elongated cylindrical body containing piezoelectric or magnetostrictive transducer elements that convert high frequency electrical currents into longitudinally propagated ultrasonic energy waves. Ultrasonic energy produced by transducer 114 is coupled to capillary bonding tool 109 by transducer horn 111. Transducer horn 111, which will be described in more detail below, provides means for efficiently coupling longitudinally propagative ultrasonic waves produced by the transducer horn to capillary bonding tool tip 110, resulting in transverse motion of the tip that is effective in forming ultrasonic wire bonds on a conductive pad or lead of workpiece 40.

Referring now to FIGS. 6–8, capillary bonding tool 109 may be seen to have an external appearance similar to that of prior art capillary bonding tools. Thus, tool 109 has a relatively long, elongated hollow tubular cylindrically-shaped body 115, the lower end of the body tapering to a short inwardly tapered frusto-conically-shaped transition section 116, and a conically-shaped tip section 117 joined at its base 118 to the lower, annular face 119 of transition section 116. Tip section 117 terminates in a tip 110.

As shown in FIGS. 6–8, tool 109 has a hollow bore 120 through body 115 that communicates with a coaxial bore 121 through tip section 117. Bores 120 and 121 are axially aligned and adapted to receive a bonding wire that is advanced through the bores during the bonding operation. Preferably, bore 120 in body 115 has a chamfered upper opening 122 adapted to minimize frictional forces on wire fed into the bore.

As shown in FIGS., 5 and 7, capillary bonding tool 109 according to the present invention is oriented in a vertical plane containing the longitudinal axis and line of action of ultrasonic transducer 114. However, as shown in FIG. 6, the lower surface of tool tip 110 is obliquely oriented with respect to the longitudinal axis, and the longitudinal axis of the tool is tilted or angularly offset from the vertical by an angle of about 10 degrees, thus offsetting body 115 and tip section 117 of the tool rearward from tip 110 of the tool.

Figure 10B:
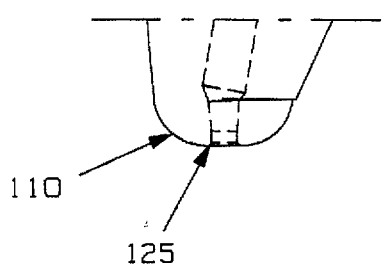
FIG. 10 is a side sectional view of the tool tip shown in FIG. 8, taken along line 10—10.
Figure 11:
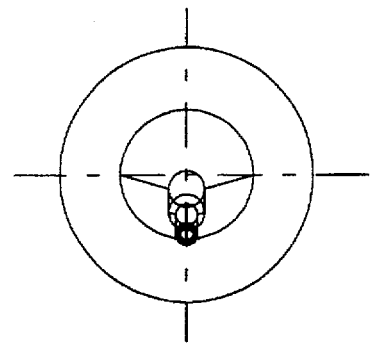
FIG. 11 is an upper plan view of the tool tip of FIG. 9.
Figure 10A:
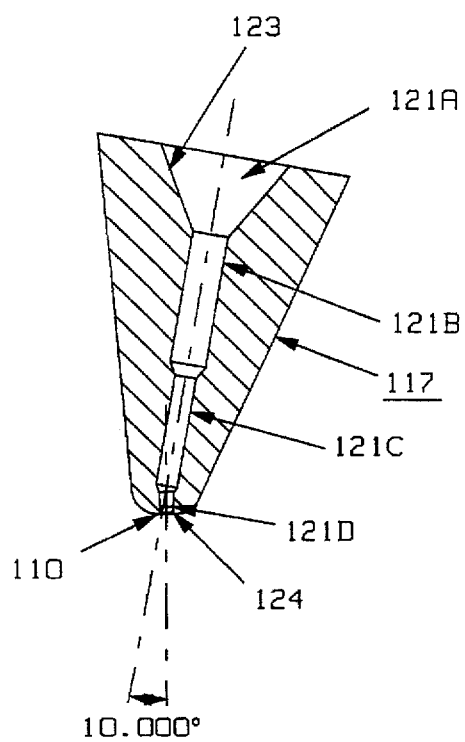
Figure 9:
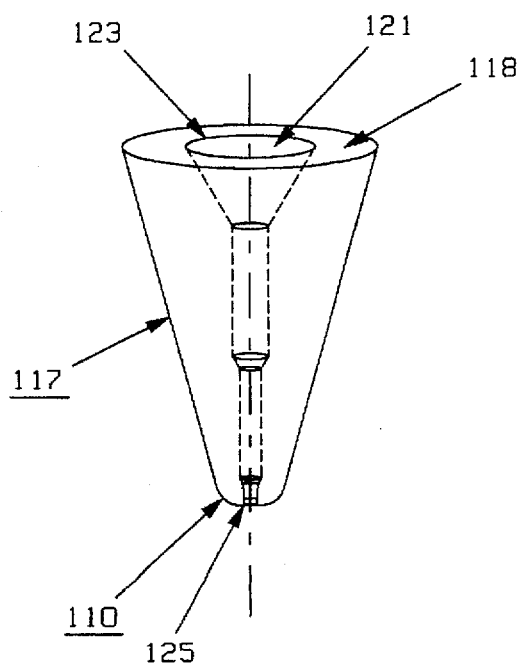
FIG. 9 is a rear elevation view of the tip of the tool shown in FIG. 6, on a further enlarged (50×) scale.

As may be seen best by referring to FIGS. 9 and 10, tip section 117 has a frustoconically-shaped, chamfered entrance opening 123 communicating with bore 121 of the tip portion, the upper end of the chamfered opening having the same diameter as bore 120 through body 115, thereby forming a smooth, obstruction-free transition between the respective bores. As shown in FIGS. 9 and 10, bore 121 through tip section 117 preferably has a tapered cross section, or stepped, successively smaller diameter sections 121A, 121B, 121C, and 121D progressing downwards to a chamfered bond wire exit opening 124. As may be seen best by referring to FIGS. 10A and 10B, outermost, smallest diameter bore section 121D, communicating with exit opening 124 of tip section 117 is inclined at an angle of 10 degrees to longitudinal bore sections 121A–121C through the tip section. Also, the flat lower surface 125 of tip section 117 is perpendicularly oriented to the axis of outermost tip bore section 121D. Therefore, with tool 109 inclined at an angle of 10 degrees rearward from its vertical line of action, as shown in FIGS. 6 and 10A, lower surface 125 of tool tip section 117 will be oriented parallel to a horizontally disposed workpiece surface, while wire exit bore 121D of the tip section will be oriented perpendicularly to the workpiece surface. This novel arrangement optimizes wire feed direction and bonding tool tip orientation for efficient wire movement and bond formation, while the angular offset of the tool body allows simultaneous and continuous direct normal viewing of a bond site, thus eliminating the possibility of making parallax errors in determining the prospective impact point of the tool tip on a workpiece location. In the preferred embodiment, tubular body of capillary tool 109 is made of ceramic, tip section 117 is made of ceramic, and the two are fastened together by bonding or made in one piece construction.

FIGS. 12–16 illustrate a novel ultrasonic transducer horn 111 according to the present invention for holding capillary bonding tool 109. Transducer horn 111 provides means for coupling transverse ultrasonic wave motion to offset capillary bonding tool 109.

As shown in FIGS. 12–16, transducer horn 111 has a generally cylindrically-shaped rear body section 126 having a rear transversely disposed face 127 in which is provided a blind threaded bore 128 adapted to threadingly receive a threaded force output stud 129 of ultrasonic transducer 114. Transducer horn 111 also has an elongated frustoconically-shaped front body section 130 coaxial with rear body section 126. The longitudinally disposed outer wall surface 136 of front body section 130 has a rear portion that is continuous with the cylindrical wall surface 133 of rear body section 126. Wall surface 136 tapers inwards to a smaller diameter front circular face 134.

Figure 14:
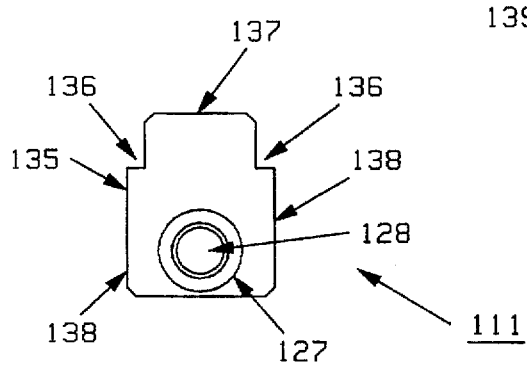
FIG. 14 is a rear elevation view of the transducer horn of FIG. 11.
Figure 13:
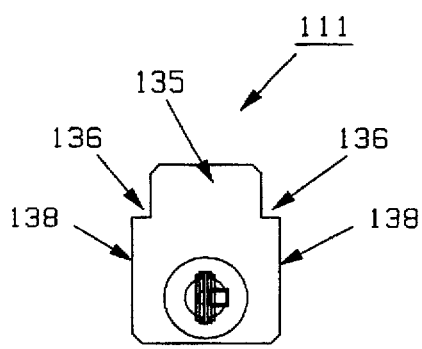
FIG. 13 is a front elevation view of the transducer horn of FIG. 12.
Figure 12:
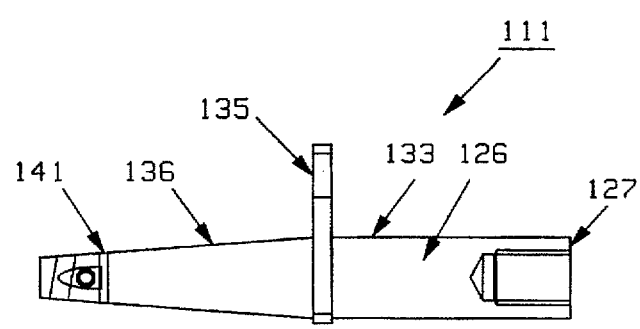
FIG. 12 is a side elevation view of a transducer horn used in the machine shown in FIG. 4, for holding the tool shown in FIG. 6, the view being on an enlarged scale (approximately 2×).

As may be seen best by referring to FIGS. 12–14, transducer horn 111 has a transversely disposed, generally rectangularly-shaped plate 135 located at the intersection between rear and front body sections 126 and 130 of the transducer horn. As may be seen best by referring to FIGS. 13 and 14, plate 135 protrudes vertically outwards from the body of transducer horn 111, and has a pair of symmetrically disposed, rectangularly-shaped notches 136 that intersect upper wall 137 and vertical side walls 138 of the plate. Plate 135 is used for mounting horn 111 to a wire bonding machine structure.

Figure 16:
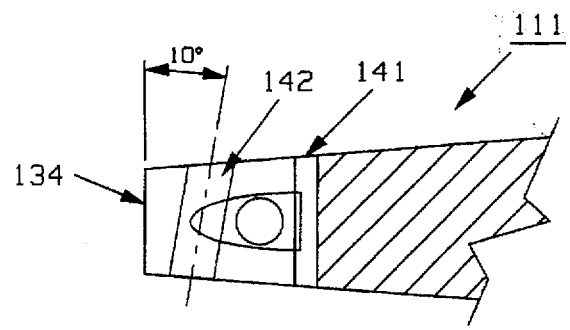
FIG. 16 is a fragmentary side sectional view of the transducer horn of FIG. 12, taken along line 16—16, on the same scale as FIG. 15.
Figure 15:
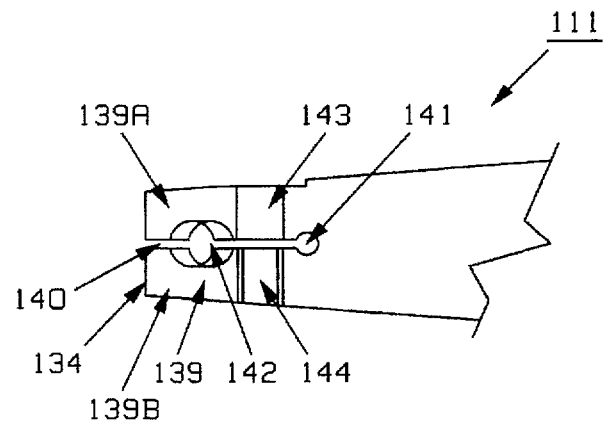
FIG. 15 is a fragmentary upper plan view of the transducer horn of FIG. 12 on a further enlarged scale (approximately 5×).

As may be seen best by referring to FIGS. 15 and 16, front body portion 130 of tool 111 has a bifurcated outer end section 139 that includes a vertically disposed slot 140 which extends longitudinally inwards from front circular face 134 of the front body portion, along a longitudinal medial plane of the body. Slot 140 terminates in a bore 141 disposed vertically through the front body portion 130 of tool 111. The function of bore 141 is for stress relief.

As may be seen best by referring to FIG. 16, the slotted front portion of transducer horn body 111 has therethrough a capillary tool-holding bore 142 adapted to receive the upper end portion of elongated tubular body 115 of capillary bonding tool 109. Tool-holding bore 142 is located between front face 134 and bore 141, lies in the same vertical medial plane as slot 140, and is angled backwards at an offset angle of 10 degrees with respect to vertically disposed front face 134 of transducer horn 111. As shown in FIG. 15, laterally opposed jaw sections 139A and 139B formed in outer transducer horn end section 139 by slot 140 have therethrough a laterally disposed through hole 143 and a threaded hole 144 adapted to receive a cap-screw 145. Cap-screw 145 is used to draw jaw sections 139A and 139B together, thereby firmly clamping the tubular body 115 of tool 109 in bore 142.

In the preferred embodiment, transducer horn 111 is fabricated by machining from metal.

FIGS. 17–29 illustrate angled wire bonding apparatus methods according to the present invention, employing wedge bonding tools, in place of the capillary bonding tools used in the apparatus shown in FIGS. 4–16 and described above. Since wire bonding machines according to the present invention using wedge bonding tools are substantially similar in structure and function to the capillary bonding machines previously described, a description of those features common to both capillary and wedge bonding tools will not be repeated here. Instead, only those features unique to wedge bonding applications will be described in detail.

Figure 17:
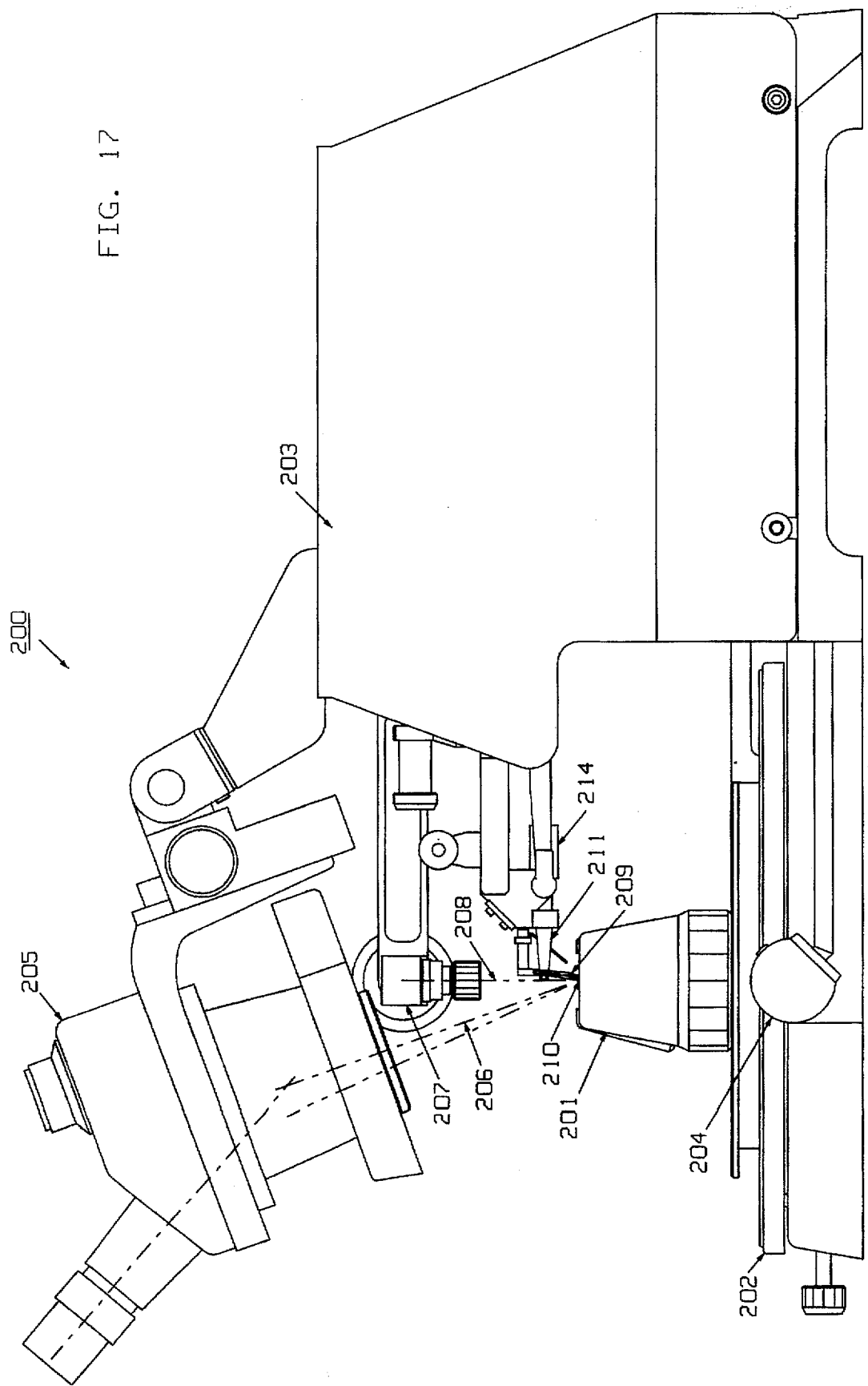
FIG. 17 is a side elevation view of a wire bonding machine employing an angled wedge tool and transducer horn according to the present invention, on a reduced scale.

Referring now to FIG. 17, a wedge wire bonding machine employing a novel angled wedge bonding tool and a novel wedge transducer horn according to the present invention is shown. As shown in FIG. 17, angled wedge tool wire bonding machine 200 according to the present invention includes a work holder 201 mounted on a platform 202, the latter being moveable with respect to the main body 203 of the machine by manual control of a micro-positioner handle. Elements 201–203 are identical in structure and function to elements 101–103 of capillary bonding machine 100 described above with reference to FIG. 4. Wedge bonding machine 200 also has a stereoscopic microscope 205 having a field of view 206, and optical imaging device 207, having a bore sight 208, and a wedge bonding tool 209 having a working tip 210.

Wedge bonding tool 209 has an elongated straight tubular body section 215 which is inclined rearward from bore sight 208 of optical imaging device 207. The upper end of tool body 215 is fastened to the outer end of an ultrasonic transducer horn 211. The novel construction of wedge bonding tool 209, and of ultrasonic transducer horn 211, which will be described in detail below, permits bore sight 208 of optical imaging device 207 to coincide with the vertical line of action 212 of tool tip 210. Optical imaging device 207 is preferably a solid state, CCD video camera.

Figure 18:
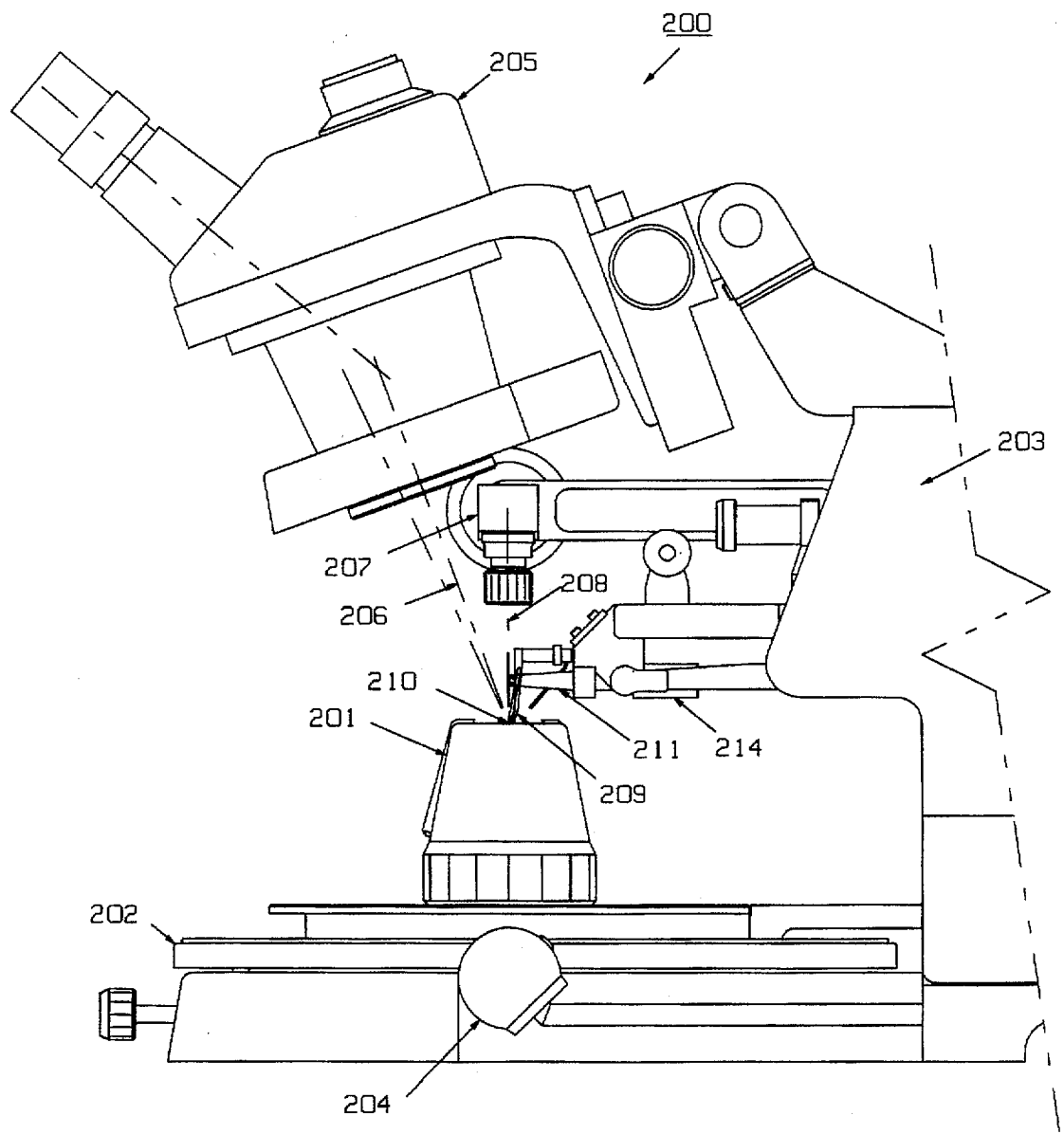
FIG. 18 is a fragmentary view of the machine of FIG. 17, on a somewhat enlarged scale.

Referring now to FIG. 18, wedge bonding machine 200 may be seen to include a bonding wire feed mechanism 213, and an ultrasonic transducer 214. Ultrasonic transducer 214 comprises a generally horizontally disposed, longitudinally elongated cylindrical body containing piezoelectric or magnetostrictive transducer elements that convert high frequency electrical currents into longitudinally propagated ultrasonic energy waves. Ultrasonic energy produced by transducer 214 is coupled to wedge bonding tool 209 by a transducer horn 211. Transducer horn 211, which will be described in more detail below, provides means for efficiently coupling longitudinally propagating ultrasonic waves produced by the transducer horn to wedge bonding tool tip 210, resulting in transverse motion of the tip that is effective in forming ultrasonic wire bonds on a conductive pad or lead of workpiece 40.

The novel construction of wedge bonding tool 209 according to the present invention may be best understood by referring to FIGS. 19–24.

Referring first to FIGS. 19–21, wedge bonding tool 209 may be seen to have an external appearance similar to that of prior art wedge bonding tools. Thus, tool 209 has an elongated generally cylindrically-shaped body or shank 215. As shown in FIG. 21, the upper end portion of shank 215 preferably has a flat 215A formed in the longitudinal wall of the shank, to provide a seating surface for a fastening set-screw, as will be described later. As shown in FIGS. 19 and 20, the lower end portion of shank 215 of wedge bonding tool 209 has a pair of laterally opposed flats 215C and 215D formed in opposite left and right side walls, the flats beginning a short distance tip 210 of the tool, angling downwards and inward towards the tip, thus forming a tip section 217 having a wedge-shape in a front elevation view, as shown in FIG. 20.

As may be seen best by referring to FIG. 23, tip section 217 of angled wedge tool 209 has a relatively short, flat lower front working face or "toe" 225A, that extends rearward from front longitudinal edge wall 215B, and a relatively longer flat wall section 225B that angles upwardly and rearwardly to intersect forwardly angled rear edge wall 215F of body 215. The rear intersection corner defines a "heel" 215G.

Referring still to FIG. 23, tip section 217 of angled wedge bonding tool 209 may be seen to have a hollow bore 220 that is disposed obliquely through the tip section. Bore 220 has a chamfered rear entrance opening 222 located in angled rear edge wall 215F of tool body 215 above heel 215G, and a chamfered exit opening 221 located in long flat wall section 225B of tip section 217, just rearward of toe 225A. Bore 220 is provided to receive through entrance opening 222 bonding wire paid out from bonding wire feed mechanism 213, and to position bonding wire paid out through exit opening 221 of the bore between a workpiece bond site and working toe face 225A. Entrance and exit openings 222 and 221 are chamfered to minimize frictional forces exerted on wire fed through bore 120.

As shown in FIGS. 18 and 20, wedge bonding tool 209 according to the present invention is oriented in a vertical plane containing the longitudinal axis and line of action of ultrasonic transducer 214. However, as shown in FIG. 19, the longitudinal axis of tool 209 is tilted or angularly offset rearward from the vertical front edge wall 215A of the tool by an angle of about 10 degrees, thus c the tool rearward from tip 210 of the tool. Now, since the dihedral angle between working face 225A and front shank edge wall 215B of tool 209 is made to be the same as conventional wedge bonding tools, i.e., slightly less than 90 degrees, with tool 209 inclined at an angle of 10 degrees rearward from the vertical line of action of the tool, as shown in FIGS. 19 and 23, working face 225A of tool tip section 217 will be oriented optimally with respect to a horizontal workpiece surface. This novel arrangement optimizes wire feed direction and bonding tool tip orientation for efficient wire movement and bond formation, while the angular offset of the tool body allows simultaneous and continuous direct normal viewing of a bond site, thus eliminating the possibility of making parallax errors in determining the prospective impact point of the tool tip on a workpiece location. In the preferred embodiment, body 215 of wedge bonding tool is made of tungsten carbide.

FIGS. 25-29 illustrate a novel ultrasonic transducer horn 211 according to the present invention, for holding wedge bonding tool 209. Transducer horn 211 provides means for coupling transverse ultrasonic wave motion to offset wedge bonding tool 209.

As shown in FIGS. 25-29, transducer horn 211 has a generally cylindrically-shaped rear body section 226, the latter having a rear transversely disposed face 227 in which is provided a blind threaded bore 228 adapted to threadingly receive a threaded force output stud 229 of ultrasonic transducer 214. Transducer horn 211 also has an elongated frustoconically-shaped front body section 230 coaxial with rear body section 226. The longitudinally disposed outer wall 236 of front body section 230 has a rear portion that is continuous with cylindrical wall 233 of rear body section 226. Wall surface 236 of front body section 230 tapers inwards to a smaller diameter front circular face 234.

Figure 29:
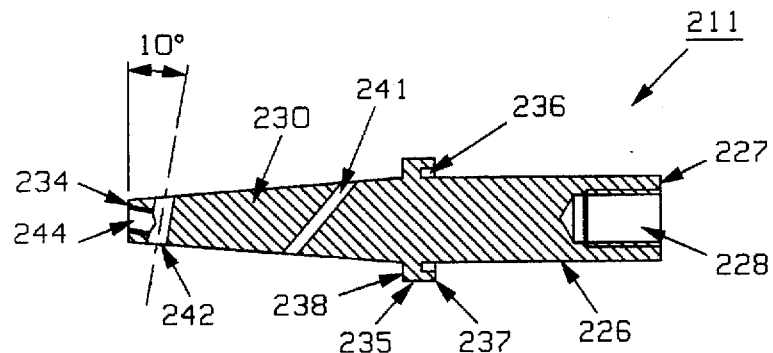
FIG. 29 is a fragmentary side sectional view of the transducer horn of FIG. 25, taken along line 29—29.
Figure 27:
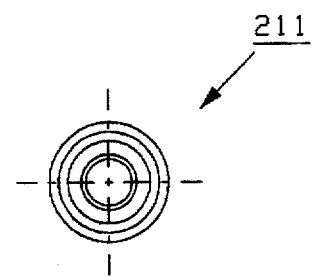
FIG. 27 is a rear elevation view of the transducer horn of FIG. 25.
Figure 25:
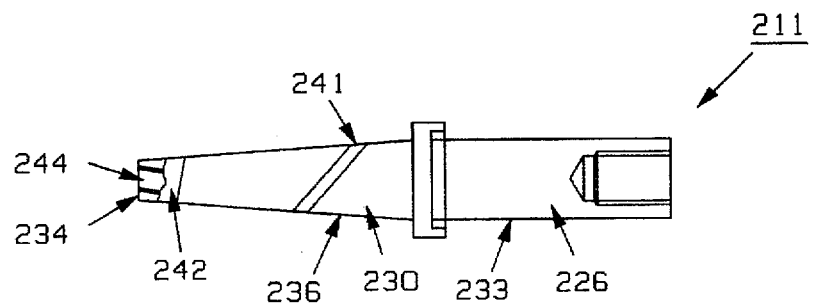
FIG. 25 is a side elevation view of a transducer horn used in the machine shown in FIG. 17, for holding the tool shown in FIG. 19, the view being on an enlarged scale (approximately 2×).

As may be seen best by referring to FIGS. 27 and 29, transducer horn 211 has a transversely disposed, annular ring 235 located at the intersection between rear and front body sections 226 and 230 of the transducer horn. As shown in those figures, ring 235, which is preferably formed integrally with rear and front body sections 226 and 230 of transducer horn 211, has parallel, transversely disposed rear and front annular walls 237 and 238, respectively. Rear wall surface 237 of ring 35 has formed therein a longitudinally forwardly protruding, annular-shaped groove 236, the radially inner cylindrical wall of which groove is common with outer cylindrical wall surface 233 of rear transducer horn body section 226. Ring 235 is used for mounting horn 211 to a wire bonding machine structure.

Figure 28:
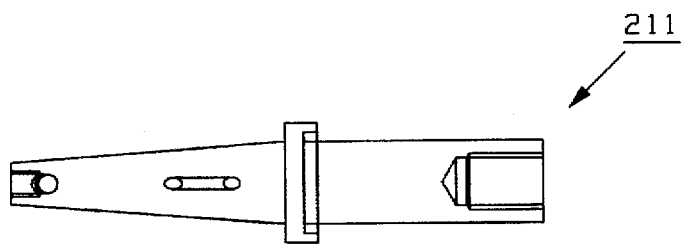
FIG. 28 is an upper plan view of the transducer horn of FIG. 25.
Figure 26:
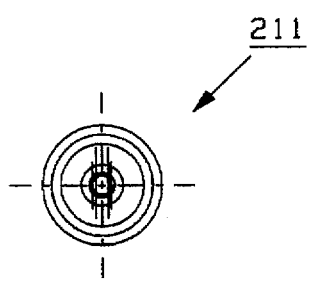
FIG. 26 is a front elevation view of the transducer horn of FIG. 25.

As may be seen best by referring to FIGS. 26, 28, and 29, front body section 230 of transducer horn 211 has therethrough a wedge tool-holding bore 242 adapted to receive the upper end portion of shank 215 of wedge bonding tool 209. Tool-holding bore 242 is located rearward of front face 234, lies in a vertical medial plane of front body section 230, and is angled backwards at an offset angle of 10 degrees with respect to vertically disposed front face 234 of transducer horn 211. As shown in FIGS. 26 and 29, transducer horn 211 is provided with a threaded set-screw bore 244 that penetrates front face 134 and extends inwards to intersect tool-holding bore 242. As may be seen best by referring to FIGS. 25 and 29, set-screw face 244 is inclined downwards from the longitudinal axis of transducer horn 211 at an angle of 10 degrees. Thus, a set-screw 245 screwed into bore 245 will perpendicularly contact shank 215 of tool 209 in tool-holding bore 242. Thus, when the set-screw 245 is tightened against flat surface 215A of shank 215, tool 209 is securely fastened to transducer horn 211.

As shown in FIG. 29, a straight bore 241 located between annular ring 235 and tool-holding bore 242 is disposed obliquely between the upper and lower wall surfaces of front body section 230 of transducer horn 211. Bore 241 lies in a vertically disposed medial plane of transducer horn 211, and is angled rearward at 40 degrees from a vertical line through tool-holding bore 242. The function of bore 241 is to allow the wire to pass through the horn and align with the bonding tool. In the preferred embodiment, transducer horn 211 is fabricated by machining from metal.

Description of the Preferred Alignment Methods

The improved alignment method according to the present invention is identical for both the angled capillary tool wire bonding machine embodiment 100 shown in FIGS. 4-16, and the angled wedge tool wire bonding machine 200 shown in FIGS. 17-29. For that reason, a complete understanding of the novel alignment methods according to the present invention may be obtained from the following description of the methods as applied to angled capillary tool wire bonding machine 100 shown in FIGS. 4-16.

Figure 30:
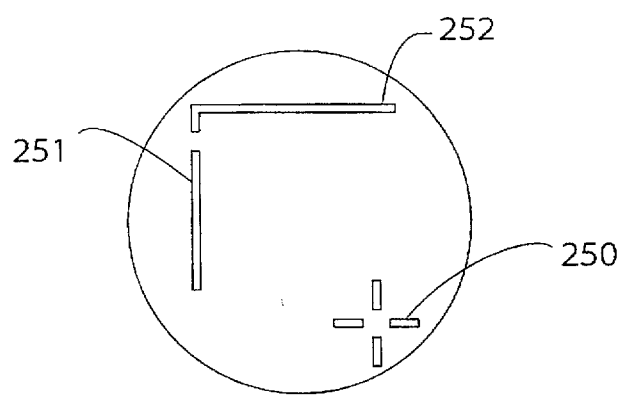
FIG. 30 is a schematic representation of a target image appearing in the field of view of an optical imaging device comprising part of the wire bonding machines shown in FIGS. 4 and 17.

Referring now to FIG. 30, a target image superimposed on the field of view of optical imaging device 107 may be seen to preferably include a pair of perpendicular, preferably open, cross hairs 250, and a pair of perpendicular lines 251 and 252 parallel to cross hairs 250, intersecting each other at a point diagonally displaced from cross hairs. Preferably, one of the corner lines, such as vertical line 251 in FIG. 30, has an open space. The function of the spaces in lines 251 and cross hairs 250 is to permit viewing of small details in a workpiece such as integrated circuit 40 shown in FIG. 3A.

Figure 31:
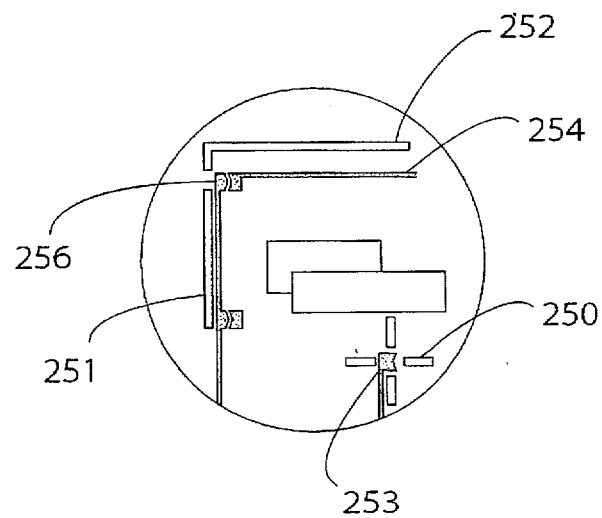
FIG. 31 is a view similar to FIG. 30, but also showing a portion of the integrated circuit of FIG. 3A in the field of view of the optical imaging device, along with the target image.

Referring now to FIGS. 4 and 5 in conjunction with FIG. 30, the initial alignment of angled capillary wedge bonding tool 100 according to the present invention comprises first placing a test workpiece on work holder 101, viewing simultaneously the general area of a test bonding pad and the approximate impact point on the pad of tool tip 110 through stereo microscope 105. Tip 110 of tool 109 is then moved downwards along its vertically oriented line of action, defined as the Z axis, and machine 100 actuated to form a bond on the test pad. As is usual in wire bonding, the tip 110 of tool 109 is moved upwards to its initial position upon completion of the bond. Next, optical imaging device 107 is moved in a plane parallel to the work holder 101 and workpiece 40 upper surfaces, i.e., in X and Y coordinate directions, until cross hairs 250 precisely center the bonded impact point of tool tip 110 on the workpiece, and the optical imaging device is mechanically locked into this aligned position. As is usual with optical imaging devices having sufficient magnification to form suitably large images of microcircuits, the depth of field of optional imaging device 107 is necessarily small. Accordingly, when tool tip 110 is raised to its upward rest position, its image becomes sufficiently de-focused to effectively disappear from the field of view of the optical imaging device. Moreover, since tool 100 is angled away from the bonded impact point, the latter is fully visible in the field of view of the optical imaging device 107, without the tool tip 110 appearing, as shown in FIGS. 30 and 31.

Having completed the initial alignment of bore-sight 108 of optical imaging device 107 with the line of action of tool tip 110 of tool 109, wire bonding machine 100 is ready for use. In the operational mode of machine 100, an integrated circuit or other such device on which wire bonds are to be formed is placed on work holder 101, and platform 102 supporting work holder 101 is moved in X and Y coordinates by operation of micro-positioner handle 104, and the platform also rotated, if necessary, until a desired wire bonding site is centered within cross hairs 250, as viewed in a television monitor or other display device coupled to optical imaging device 107. With the desired bond site precisely aligned with the cross hairs 250, so to is the line of action of tip 110 of tool 109. Accordingly, the tool tip can then be lowered into bonding contact with the assurance that a wire bond will be formed at the precise location desired.

Although the novel wire bonding apparatus and methods described above were directed to manual wire bonding machines, for ease of description, it is to be understood that the angularly offset bonding tool and alignment method are equally advantageous for use with automatic wire bonding machines. Thus, as shown in FIG. 31, an automatic wire bonding machine utilizing a novel angular offset bonding tool according to the present invention utilizes an initializing procedure in which a workpiece is moved until cross hairs 250 of optical imaging device 107 are centered on a feature 253 of an integrated circuit, while perpendicular lines 259 and 257 of the target pattern are aligned with outer edge features 254 and 255 of the integrated circuit. This initialization procedure typically requires rotation as well as translation of a workpiece supporting platform to achieve alignment of the workpiece geometry with the X-Y coordinate system of the bonding machine platform actuation servo system. The open space in vertical target image line 251 may be used to assist in aligning the workpiece location with respect to the bonding tool, manipulating the workpiece holder platform until a third feature 256 of integrated circuit 40 is centered within the open space.

After an integrated circuit or other such workpiece has been brought into alignment with the coordinate system of an automatic wire bonding machine employing an angular bonding tool according to the present invention, according to the procedure described above, a pre-programmed bonding sequence utilizing stepper motors to effect X and Y movements of the workpiece, and a Z axis stepper motor to effect bonding tool vertical movement, may be initiated. This sequence utilizes circuitry within bonding machine main body 103 which is known in the art, and not shown.

It is important to note that some automatic wire bonding machines utilize pattern recognition algorithms that permit detection of misaligned or mislocated components on a workpiece substrate, yet allowing a wire bond to be made to an exact location on such a component. With prior art alignment methods, this pattern recognition process requires moving the workpiece relative to the tool, to a known laterally offset position prior to viewing the portion of the workpiece needed to perform pattern recognition. By way of contrast, the angled wire bonding tool and method according to the present invention permits direct normal viewing of the impact point of the bonding tool, even during the bonding operation. Thus, pattern recognition can occur simultaneously with the bonding operation, substantially speeding up the recognition process and throughput of the bonding machine.

What is claimed is:

1. An improvement in ultrasonic wire bonding machines of the type having a support structure, a workpiece holder platform having a generally flat upper surface adapted to hold a workpiece thereon, said workpiece having metallic bonding sites substantially parallel to said platform surface, an ultrasonic force generator mechanically coupled to an ultrasonic wire bonding tool having a working tip adapted to move perpendicularly downwards into contact with a bonding site and transmits transversely directed ultrasonic bond-forming energy waves, and means for moving said workpiece relative to said bonding tool tip so as to bring different desired bonding sites into alignment with the normally directed line of action of said tool tip relative to said workpiece, said improvement comprising an ultrasonic wire bonding tool having an elongated straight body, a tip section having a lower working face oriented parallel to said platform and adapted to transmit transverse ultrasonic wave energy to said bonding sites on said workpiece, said body having an upper end mechanically coupled to said ultrasonic force generator, said body being angled obliquely from said working face to said ultrasonic force generator, whereby said contact point of said tip with said bonding site may be viewed normally along said line of action of said tool tip, thereby permitting direct and continuous visual alignment of said tool tip with said bond site, said bonding tool being a capillary ball bonding type having a longitudinally disposed bore running through said tool, said bore having in the upper end of the body thereof an upper entrance opening for receiving bonding wire, and having in the lower working surface of the tip section thereof a wire exit opening.

2. The wire bonding machine of claim 1 further including an optical imaging device having a line of sight coincident with said line of action of said bonding tool tip.

3. The wire bonding machine of claim 2 wherein said optical imaging device is further defined as having its input aperture located above said bonding tool tip and said workpiece holder platform.

4. The wire bonding machine of claim 2 wherein said optical imaging device is further defined as being a closed circuit television camera.

5. An improvement in ultrasonic wire bonding machines of the type having a support structure, a workpiece holder platform having a generally flat upper surface adapted to hold a workpiece thereon, said workpiece having metallic bonding sites substantially parallel to said platform surface, an ultrasonic force generator mechanically coupled to an ultrasonic wire bonding tool having a working tip adapted to move perpendicularly downwards into contact with a bonding site and transmit transversely directed ultrasonic bond-forming energy waves, and means for moving said workpiece relative to said bonding tool tip so as to bring different desired bonding sites into alignment with the normally directed line of action of said tool tip relative to said workpiece, said improvement comprising an ultrasonic wire bonding tool having an elongated straight body, a tip section having a lower working thee inclined at an angle of at least about 100 degrees to the longitudinal axis of said body and oriented parallel to said platform and adapted to transmit transverse ultrasonic wave energy to said bonding sites on said workpiece, said body having an upper end mechanically coupled to said ultrasonic force generator, said body being angled obliquely from said working face to said ultrasonic force generator, whereby said contact point of said tip with said bonding site may be viewed normally along said line of action of said tool tip, thereby permitting direct and continuous visual alignment of said tool tip with said bond site.

6. A tool for ultrasonic ball wire bonders comprising an elongated hollow body having a straight upper shank portion and having through said body a capillary bore, and an inverted conically-shaped tip section having through the center thereof an exit opening communicating with the lower part of said bore for dispensing bonding wire, said tip section having adjacent said exit opening a flattened working face, inclined at an oblique angle to the longitudinal axis of said elongated straight tube section, said tool including coupling means for coupling thereto ultrasonic acoustic energy waves from an ultrasonic transducer having a longitudinally disposed force output member oriented substantially parallel to working face of said tip section, said coupling means being adapted to match the acoustic input impedance of said tip section in moving transversely to effect wire bond formation with a horizontally disposed workpiece bonding site, to the impedance of said transducer, said coupling means comprising an impedance matching acoustic horn including a longitudinally elongated body having an input end adapted to mechanically couple to said transducer three producing member, and an output end including output coupling means to couple acoustic energy to the upper end of said tool shank, said output coupling means including a bore through the front end portion of said body for holding the shank of said tool, said bore lying in a vertical plane of said horn body and being inclined to the longitudinal axis of said body at approximately the same oblique angle existing between said working face and said longitudinal axis of said shank, said oblique angles between said longitudinal axis of said shank of said tool, said longitudinal axis of said transducer body, and sold horn body being at least about 100 degrees.

7. A method for aligning the impact location of the working face of an elongated ultrasonic bonding tool with a desired bonding site of a workpiece on a workpiece holder, said tool tip having a line of action from a spaced apart non-bonding position to a workpiece contacting position that is oriented normal to said workpiece, said method comprising;

a. inclining the longitudinal axis of said tool with respect to its said line of action, b. viewing with an optical imaging device said workpiece holder normally along a line of sight coincident with said line of action of said tool tip, c. moving said tool tip along its line of action to impact a point on a test workpiece on said workpiece holder, d. calibrating a target pattern within the field of view of said optical imaging device with said test impact point, e. removing said test workpiece from said work holder and replacing it with a production workpiece, f. moving said production workpiece relative to said target pattern so as to bring said target pattern into coincidence with a desired bonding tool tip impact point on said production workpiece, g. moving said bonding tool tip down along its line of action into contact with said prospective bonding site, and h. applying ultrasonic energy to said tool to form a bond at said site.

8. The wire bonding machine of claim 1 wherein said bonding tool is further defined as being a wedge bonding type having an elongated straight upper shank section, and a wedge-shaped lower tip section, said tip section having a flat or concave front lower working face or toe inclined obliquely to the longitudinal axis of said shank and a flat sole section depending upwardly and at an angle from said toe section to intersect at a dihedral angle the rear, generally vertically disposed edge wall of said tip section, forming therewith a heel, said tip section having therethrough a diagonally disposed bore provided with an entrance opening located above said heel for receiving bonding wire, and an exit opening through said sole section between said toe and heel for dispensing bonding wire to a bonding site.

* * * * *